United States Patent [19]

Swanson et al.

[11] Patent Number: 5,057,439
[45] Date of Patent: Oct. 15, 1991

[54] METHOD OF FABRICATING POLYSILICON EMITTERS FOR SOLAR CELLS

[75] Inventors: Richard M. Swanson, Los Altos; Jon-Yiew Gan, Stanford, both of Calif.

[73] Assignee: Electric Power Research Institute, Palo Alto, Calif.

[21] Appl. No.: 478,616

[22] Filed: Feb. 12, 1990

[51] Int. Cl.$^5$ ............................................. H01L 31/18
[52] U.S. Cl. ...................... 437/2; 136/256; 357/30; 357/65; 437/4; 437/186
[58] Field of Search ................. 437/2, 4, 152, 164, 437/186; 136/256, 261; 357/30 J, 30 Q, 65

[56] References Cited

U.S. PATENT DOCUMENTS 4,403,392  9/1983  Oshima et al. ...................... 437/161
4,502,206  3/1985  Schnable et al. ..................... 437/24

FOREIGN PATENT DOCUMENTS 58-119677  7/1983  Japan ................................... 136/256

OTHER PUBLICATIONS

R. A. Sinton et al., *IEEE Trans. Electron Dev.*, vol. ED-34, Oct. 1987, pp. 2116–2123.
Y. Kwark et al., *Conference Record, 18th IEEE Photovoltaic Specialists Conf.* (1985), pp. 787–791.
F. A. Lindholm et al., *Conference Record, 18th IEEE Photovoltaic Conference* (1985), pp. 1003–1007.

Primary Examiner—Aaron Weisstuch
Attorney, Agent, or Firm—Henry K. Woodward

[57] ABSTRACT

Polysilicon contacts for silicon devices such as bipolar junction transistors and silicon solar cells are fabricated in a two step anneal process to improve contact resistance and emitter saturation current density. After a silicon oxide layer is formed on a surface of a silicon substrate, a plurality of openings are formed there through to expose a plurality of contact surfaces on the surface of the silicon substrate. A thin thermally grown silicon oxide layer is then formed on the contact surfaces after which an undoped layer of polysilicon material is formed over the silicon oxide layers. The structure is then annealed at approximately 1050° C. to break the thermally grown silicon oxide layer. Thereafter, a first layer of doped glass is formed over the silicon oxide surface and selectively etched to remove the first layer of glass from a first group of contact surfaces. A second layer of doped glass is then formed over the first group of contact surfaces and over the first layer of doped glass. Thereafter, the silicon substrate is annealed at a temperature of approximately 900° C. thereby driving in dopants from said first and second layers of glass into said polysilicon layer over said first and second groups of contact surfaces. Finally, the layers of glass are removed and the polysilicon layer is patterned to define first and second polysilicon contacts.

13 Claims, 3 Drawing Sheets

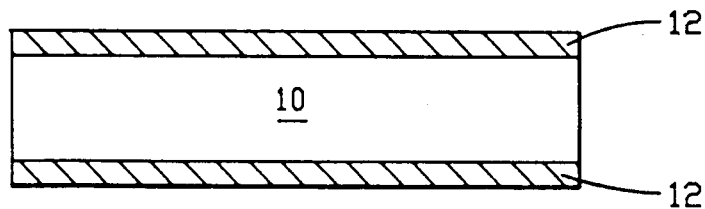
FIG.–1
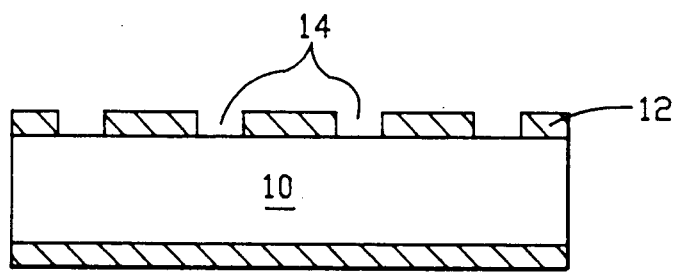
FIG.–2
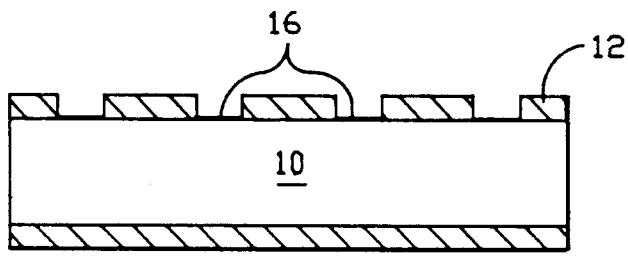
FIG.–3
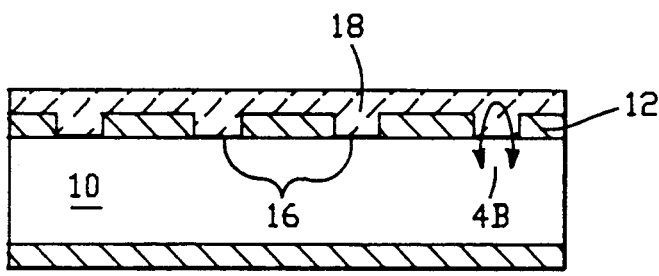 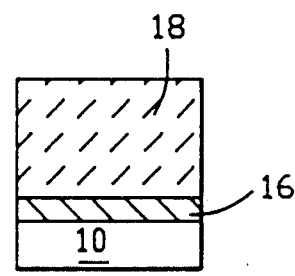
FIG.–4A          FIG.–4B

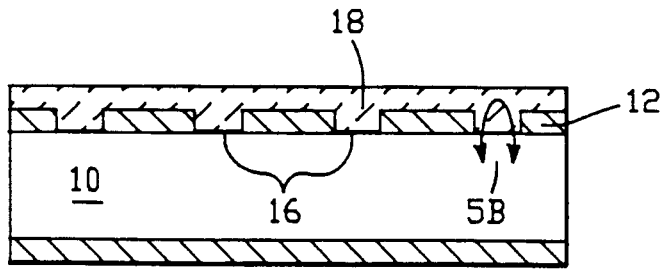
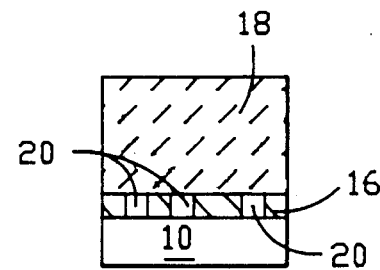
FIG.-5A  FIG.-5B
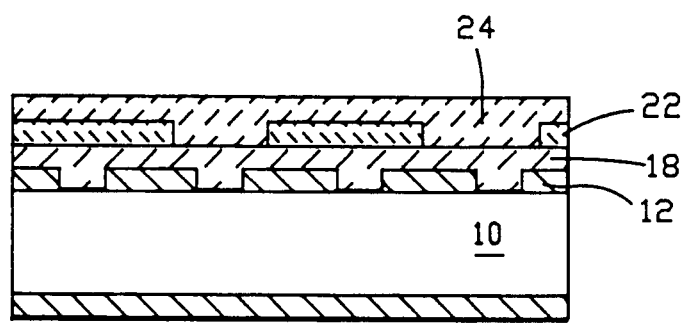
FIG.-6
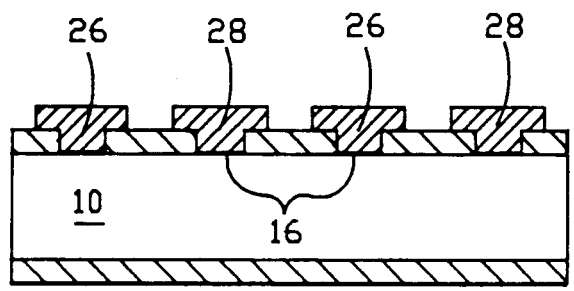
FIG.-7

METHOD OF FABRICATING POLYSILICON EMITTERS FOR SOLAR CELLS

BACKGROUND OF THE INVENTION

This invention relates generally to semiconductor technology, and more particularly the invention relates to an improved method of fabricating polysilicon emitters in semiconductor devices such as silicon solar cells.

The doped polycrystalline silicon (polysilicon) contact is used in many semiconductor devices such as transistors and solar cells. The silicon solar cell, for example, comprises a silicon body having a plurality of P-doped polysilicon contacts and a plurality of N-doped polysilicon contacts for receiving electron and holes generated in the silicon body in response to impinging solar radiation.

Two desirable characteristics in a polysilicon emitter or contact are low emitter saturation current ($J_0$) and low contact resistance. However, the two characteristics cannot both be optimized due to certain process incompatibilities. Achieving a low contact resistance requires a high temperature annealing; however, high temperature annealing out diffuses dopant from the contact into the substrate, thereby reducing the integrity of the interfacial oxide and reducing $J_0$.

Conventionally, in fabricating the doped polysilicon contacts a doped polysilicon layer is vapor deposited on the surface of a silicon substrate. A high temperature annealing process is employed to break the interfacial oxide and activate the dopant in the polysilicon layer.

A misconception about the interfacial oxide of polysilicon emitters is that the contact resistance of polysilicon emitters is too high for device applications if the interfacial oxide is not broken completely. Consequently, the conventional process is designed to suppress any growth of the interfacial oxide before the polysilicon deposition. Normally this leads to a very thin native oxide sandwiched between the polysilicon and the substrate. The native oxide is inevitable since it forms simply by exposing the silicon wafer to air before the polysilicon deposition. Native oxide is not stable and can be broken completely at rather low temperatures. As a result, the oxide breaking processes is incorporated in the process of drive-in for the polysilicon emitter formation.

The present invention is directed to a novel two-step annealing process which yields polysilicon emitters with enhanced low contact resistance and low emitter saturation current.

SUMMARY OF THE INVENTION

An object of the present invention is an improved polysilicon emitter.

Another object of the invention is a polysilicon emitter contact having improved emitter saturation current density and contact resistance.

A feature of the invention is a two-step annealing process whereby interfacial oxide is broken in a first anneal step before emitter dopant is present, and a second anneal step is utilized for emitter dopant drive-in and activation.

Briefly, in accordance with a preferred embodiment of the invention contact areas are defined in a silicon oxide layer on the surface of a silicon substrate by selectively etching the oxide and exposing surface areas of the silicon substrate. This prevents the formation of a native oxide. Thereafter, an undoped polysilicon layer is deposited on the silicon oxide layer and on the contact areas. The structure is then annealed to break the interfacial oxide without the risk of any dopant out diffusing from the polysilicon into the substrate. One or more doped oxide or glass layers are then sequentially deposited and selectively etched for subsequent out diffusion of the dopant into selected polysilicon contacts. After the glass layers are deposited and patterned, the structure is again annealed to out diffuse dopant from the glass into the underlying polysilicon contacts. Accordingly, P and N contacts can be sequentially formed for a solar cell structure. Advantageously, the second anneal can be at a lower temperature than the first anneal. The doped glass layers can then be removed.

The invention and objects and features thereof will be more readily apparent from the following detailed description and appended claims when taken with the drawing.

BRIEF DESCRIPTION OF THE DRAWING

FIG. 1 through FIG. 7 are section views of a portion of a silicon solar cell during fabrication thereof in accordance with the invention.

DETAILED DESCRIPTION OF ILLUSTRATIVE EMBODIMENTS

Figure 8:
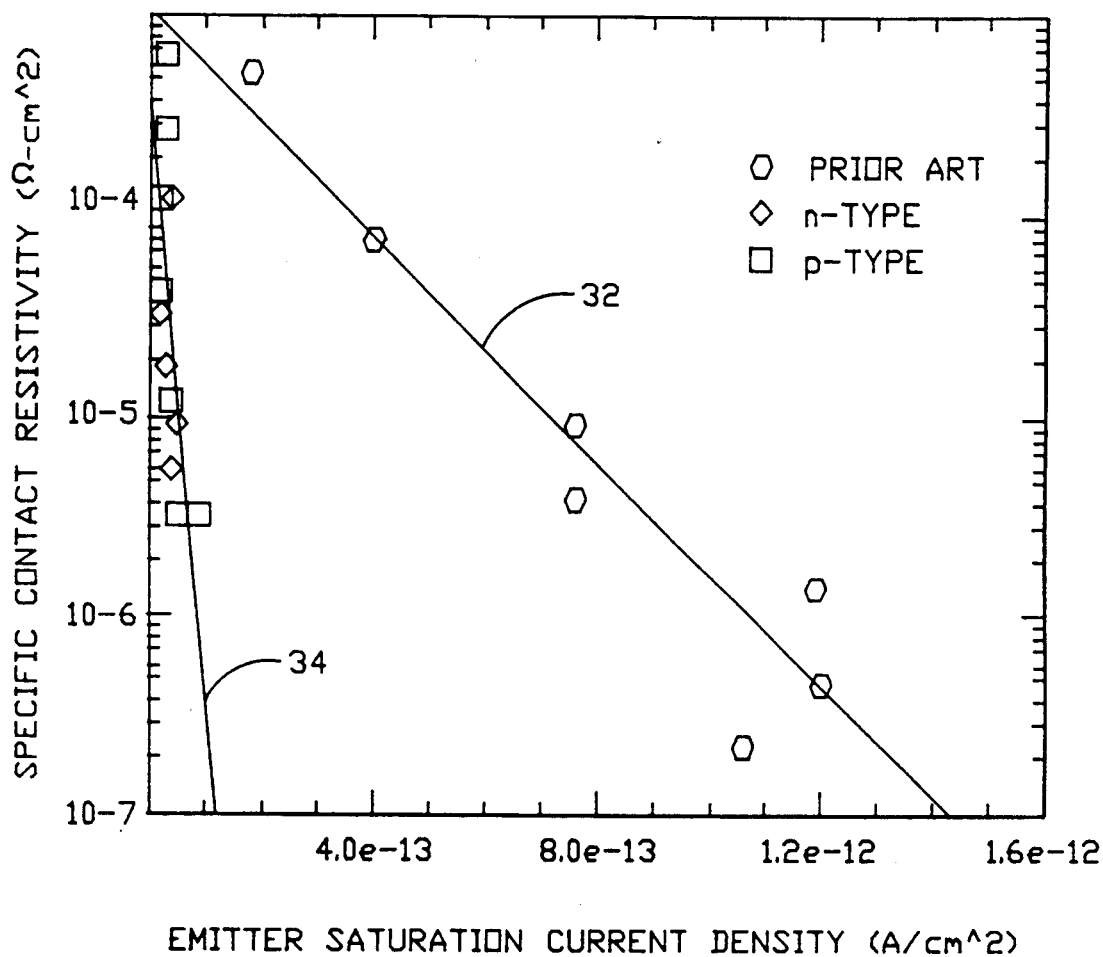
FIG. 8 is a plot illustrating specific contact resistivity vs. emitter saturation current density in accordance with the present invention and in accordance with the prior art.

Referring now to the drawings, FIG. 1-7 are section views illustrating the fabrication of a silicon solar cell in which a plurality of P-doped contacts and a plurality of N-contacts are formed on one surface of a silicon substrate. In FIG. 1 a silicon substrate 10 has silicon oxide layers 12 grown on opposing sides of the wafer. The oxide on the side which receives radiation (sunward side) acts as a passivation layer to reduce recombination of holes and electrons. The oxide on the opposite or backside is used to separate N and P-type contacts.

In FIG. 2 the top silicon oxide layer 12 is selectively etched to define the contact pattern. Importantly, the oxide on the contact surfaces 14 of the substrate 10 is completely removed by etching. Thereafter, as shown in FIG. 3 a thin (e.g. 23 angstroms) silicon oxide layer 16 is thermally grown on the contact surfaces. This can be accomplished by heating the wafer at 800° C. for approximately 10 minutes. The thermally grown oxide 16 has a better electronic quality than native oxide which would form when the exposed silicon surface is exposed to ambient atmosphere.

In FIG. 4A an undoped polysilicon layer 18 is deposited on the surface of the silicon oxide layer 12 and over the contact areas in contact with the thermally grown oxide 16. FIG. 4B is an enlarged view of one region of a contact area showing the polysilicon layer 18 on the interfacial oxide 16 formed on the surface of silicon substrate 10.

Thereafter as shown in FIGS. 5A and 5B the structure is annealed at a high temperature to break the interfacial oxide and permit electrical contact between the polysilicon emitters and the underlying substrate. Either the anneal temperature or the annealing time can be used to control the extent of the interfacial oxide which is broken. For solar cell applications, the typical anneal temperature is 1050° C., and fine adjustment is accomplished by varying the anneal time. As shown in the enlarged view of FIG. 5B, the interfacial oxide is broken partially and polysilicon contacts the substrate intimately in the broken areas. Importantly, the polysilicon layer 18 is undoped during the first anneal, therefore no dopant out diffuses into the underlying substrate.

In FIG. 6 a phosphorus glass layer 22 is formed over the polysilicon layer 18 and selectively patterned by etching to be above alternate contact surface areas. Thereafter a boron glass layer 24 is deposited and overlays contact surface areas intermediate the contact surface areas beneath the phosphorus glass layer 22. Accordingly, half of the contacts are covered by phosphorus glass while the other half are covered by boron glass which will subsequently define the P and N type contacts, respectively.

Thereafter, the structure is thermally annealed at a temperature on the order of 900° C. during which both the phosphorus and boron dopants are driven into the underlying polysilicon simultaneously. After the dopant drive-in, the two glass layers are removed and the doped polysilicon layer is selectively etched to define P contacts 26 and N contacts 28 as shown in FIG. 7.

The described two-stepped anneal process permits very low saturation current density. The thin thermally grown oxide has better electronic quality than native oxide and a very shallow junction is formed with substrate. Further, the contact resistance is reduced by the presence of the broken regions in the thin silicon oxide layer which are created during the first anneal, as described above.

FIG. 8 is a plot of specific contact resistivity in ohms per square centimeter vs. emitter saturation current density in amperes per square centimeter. Curve 32 is based on a prior art process disclosed by Grabbe in IEDM 1986. Curve 34 is measured results using the process outlined above for a silicon solar cell. The enhanced contact resistivity and saturation current density is obvious from a comparison of the two curves.

The two-step anneal process in accordance with the invention has proved to be successful in fabricating polysilicon emitters having enhanced characteristics. The emitters are useful in bipolar junction transistors, for example, as well as in silicon solar cells.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A method of fabricating a polysilicon contact on a surface of a silicon substrate, comprising the step of
   a) providing a first silicon oxide layer on said surface,
   b) forming an opening through said first silicon oxide layer, thereby exposing a contact surface on said surface of said silicon substrate,
   c) thermally growing a second silicon oxide layer on said contact surface, the thickness of said second silicon oxide layer being less than the thickness of said first silicon oxide layer,
   d) forming a layer of undoped polysilicon material over said first silicon oxide layer and on said second silicon oxide layer,
   e) annealing said silicon substrate to break said second layer of silicon oxide, thereby providing electrical contact between said substrate and said undoped polysilicon material at said contact surface,
   f) providing a layer of glass over said contact surface, said layer of glass containing atoms of a dopant, and
   g) annealing said silicon substrate and driving said atoms of said dopant from said layer of glass into said layer of polysilicon material.

2. The method as defined by claim 1 and further including:
   h) removing said layer of glass after step g.

3. The method as defined by claim 2 and further including:
   i) selectively etching said layer of polysilicon after step g thereby defining a doped polysilicon contact on said contact surface.

4. The method as defined by claim 3 wherein step c) includes heating said substrate at approximately 800° C. for 10 minutes.

5. The method as defined by claim 3 wherein step e) includes heating said substrate at approximately 1050° C.

6. The method as defined by claim 3 wherein step g) includes heating said substrate at approximately 900° C.

7. The method as defined by claim 3 wherein step c) includes thermally growing a second silicon oxide layer of approximately 23 angstroms thickness.

8. The method as defined by claim 3 wherein step c) includes heating said silicon substrate at approximately 800° C. for 10 minutes, step e) includes heating said substrate at approximately 1050° C., and step g) includes heating said substrate at approximately 900° C.

9. The method as defined by claim 1 wherein step c) includes thermally growing a second silicon oxide layer of approximately 23 angstroms thickness.

10. A method of fabricating P and N contacts on a surface of a silicon substrate during the fabrication of a silicon solar cell, comprising the steps of
    a) providing a first silicon oxide layer on said surface,
    b) forming a plurality of openings through said first silicon oxide layer thereby exposing contact surfaces on said surface of said silicon substrate,
    c) thermally growing second silicon oxide layers on said contact surface, the thickness of said second silicon oxide layers being less than the thickness of said first silicon oxide layer,
    d) forming a layer of undoped polysilicon material over said first silicon oxide layer and on said second silicon oxide layer,
    e) annealing said silicon substrate to break said second layer of silicon oxide, thereby providing electrical contact between said substrate and said undoped polysilicon material at said contact surface,
    f) providing a first layer of glass over said contact surfaces, said layer of glass containing atoms of a first dopant,
    g) selectively etching said first layer of glass thereby removing said first layer of glass from over a first group of contact surfaces and leaving said first layer of glass over a second group of contact surfaces,
    h) providing a second layer of glass over said layer of polysilicon material and over said first group of contact surfaces, said second layer of glass containing atoms of a second dopant, and
    i) annealing said silicon substrate and driving atoms of dopants from said first layer of glass into said second group of contact surfaces and driving atoms of said second dopant from said second glass layer into said first group of contact surfaces.

11. The method as defined by claim 10 and further including the steps of:
   j) removing said layers of glass after step i) and k) selectively etching said layer of polysilicon, thereby defining a plurality of doped polysilicon contacts on said contact surfaces.

12. The method as defined by claim 11 wherein step c) includes heating said silicon substrate at approximately 800° C. for 10 minutes, thereby forming a thermally grown silicon oxide layer of approximately 23 angstroms, step e) includes heating said substrate at approximately 1050° C., and step i) includes heating said substrate at approximately 900° C.

13. The method as defined by claim 10 wherein step c) includes heating said silicon substrate at approximately 800° C. for 10 minutes, thereby forming a thermally grown silicon oxide layer of approximately 23 angstroms, step e) includes heating said substrate at approximately 1050° C., and step i) includes heating said substrate at approximately 900° C.

* * * * *